United States Patent
Biber et al.

(10) Patent No.: US 8,912,797 B2
(45) Date of Patent: Dec. 16, 2014

(54) PRINTED CIRCUIT BOARD WITH INTEGRATED SHIELDING

(75) Inventors: Stephan Biber, Erlangen (DE); Heinz Hahn, Möhrendorf (DE); Martin Hemmerlein, Bamberg (DE); Jörg Rothard, Litzendorf (DE)

(73) Assignee: Siemens Aktiengesellschaft, München (DE)

( * ) Notice: Subject to any disclaimer, the term of this patent is extended or adjusted under 35 U.S.C. 154(b) by 659 days.

(21) Appl. No.: 13/188,370

(22) Filed: Jul. 21, 2011

(65) Prior Publication Data

US 2012/0187950 A1    Jul. 26, 2012

(30) Foreign Application Priority Data

Jul. 22, 2010 (DE) .......................... 10 2010 031 933

(51) Int. Cl.
*G01V 3/00* (2006.01)
*G01R 33/36* (2006.01)
*G01R 33/422* (2006.01)

(52) U.S. Cl.
CPC .......... *G01R 33/3685* (2013.01); *G01R 33/422* (2013.01); *G01R 33/36* (2013.01)
USPC .............................. 324/322; 324/318; 333/116

(58) Field of Classification Search
USPC ............................ 324/322, 318; 333/116, 246
See application file for complete search history.

(56) References Cited

U.S. PATENT DOCUMENTS

| | | | | | |
|---|---|---|---|---|---|
| 4,349,799 | A | * | 9/1982 | Blocksome et al. | 333/246 |
| 4,356,461 | A | * | 10/1982 | Acoraci | 333/116 |
| 5,371,466 | A | * | 12/1994 | Arakawa et al. | 324/322 |

FOREIGN PATENT DOCUMENTS

| | | |
|---|---|---|
| DE | 10 2004 015 856 A1 | 10/2005 |
| DE | 20 2010 003 162 U1 | 5/2010 |

OTHER PUBLICATIONS

German Office Action dated Jun. 27, 2011 for corresponding German Patent Application No. DE 10 2010 031 933.3 with English translation.

* cited by examiner

*Primary Examiner* — Louis Arana
(74) *Attorney, Agent, or Firm* — Lempia Summerfield Katz LLC

(57) ABSTRACT

A printed circuit board (PCB) is flat, providing a top side and a bottom side. A plurality of terminations is disposed on the top side in proximity to one end face of the PCB. Each termination has at least one contact that is connected to a respective conductor track of the PCB. The respective conductor track is connected to a respective local coil or to a contact disposed on the top side or the bottom side of a respective further termination. The local coil and/or at least one of the further terminations are disposed in proximity to the other end face. A basic shield impervious to frequencies in a magnetic resonance range is disposed on the top side and/or the bottom side, and an auxiliary shield electrically connected to the basic shield and impervious to frequencies in the magnetic resonance range is disposed on narrow sides of the PCB.

20 Claims, 3 Drawing Sheets

PRINTED CIRCUIT BOARD WITH INTEGRATED SHIELDING

This application claims the benefit of DE 10 2010 031 933.3, filed Jul. 22, 2010.

BACKGROUND

The present embodiments relate to a printed circuit board.

In MR tomography, images having a high signal-to-noise ratio (SNR) may be acquired using local coils. The nuclei of the atoms excited to magnetic resonances induce a voltage in the local coil, the induced voltage being amplified using a low-noise (pre)amplifier (LNA). The amplified signal is forwarded to receive electronics. The signal may be forwarded via shielded cables (e.g., coaxial cables).

High-field systems (e.g., magnetic resonance systems, in which the static basic magnetic field is in the region of 3 Tesla or more) are employed even in the case of high-resolution images in order to improve the signal-to-noise ratio further.

More coils may be connected to a magnetic resonance receiving system than there are receive channels present. For this reason, a switching array is installed between the receive antennas and the receive electronics. The switching array routes the currently active local coils onto the receive channels present. This enables more local coils to be connected to the receive electronics than there are receive channels available.

The local coils are positioned in the radio-frequency transmit field of the body coil (BC; e.g., whole-body coil). The body coil is a large coil that encompasses the body of the examination subject (e.g., a human being) and is used to excite the spins in the body. The body coil generates a circularly or elliptically polarized radio-frequency field. Owing to the radio-frequency field, currents are induced on all the conductors located within the radio-frequency field. Resonance effects may be produced (e.g., in the case of relatively long cables) with the result that high currents flow in the shielding. The currents may be so great that the currents may lead to a patient being put at risk due to heating. Even before such hazardous situations occur, the induced currents may also cause secondary radio-frequency fields that destroy the homogeneity of the radio-frequency field generated by the body coil.

A further problem occurs if there is a discontinuity in the shielded cable (e.g., if the shielded cable is soldered onto a printed circuit board or the shielded mode is exited in some other way). In that case, the preamplified receive signals transmitted over the shielded conductors may also cause interference. For example, if the cable is routed in proximity to an antenna, the preamplified signal may feed back into the antenna again. This may result in self-oscillation of the local coil.

Standing wave traps may be used for suppressing shield currents. Various design formats for standing wave traps are known. It is known, for example, to wind a coaxial cable into a coil and to connect two points of the shield to an appropriately dimensioned capacitor. It is also known to cover a coaxial cable with an electrically conductive outer sleeve (e.g., a balun) and connect the balun capacitively to the cable shield. Other types of design are also known.

Prior art standing wave traps have various disadvantages. Thus, for example, the standing wave traps are wound manually and consequently are expensive. Solder joints are also applied manually to the cable shields, which is problematic in manufacturing process terms. Because of the large diameter of coaxial cables and the large bending radius associated therewith, standing wave traps also have high space requirements. The space requirement is problematic, for example, in the case of coils that are intended to be mechanically flexible. Large volumes are used for the standing wave traps (e.g., when a plurality of coaxial cables are to be routed substantially in parallel).

Individual shielded wires may not be brought out from the shield before the end of the cable.

SUMMARY AND DESCRIPTION

The present embodiments may obviate one or more of the drawbacks or limitations in the related art. For example, the routing of cables from local coils to receive electronics may be simplified.

In one embodiment, a printed circuit board is configured such that a plurality of terminations for shielded cables are disposed on a top side of the printed circuit board in proximity to one end face of the printed circuit board. Each of the terminations has at least one contact that is connected to a respective conductor track of the printed circuit board. The respective conductor track starts from the respective contact and extends in the direction of the other end face of the printed circuit board. The respective conductor track is connected either to a respective local coil for magnetic resonance applications that is disposed on the printed circuit board or to a contact, disposed on the top side or on the bottom side, of a respective further termination for a respective further shielded cable. The local coil and/or at least one of the further terminations are disposed in proximity to the other end face. The conductor tracks run in at least one intermediate layer of the printed circuit board. The at least one intermediate layer is disposed between the top side and the bottom side. A basic shield that is impervious to frequencies in a magnetic resonance range is disposed on the top side and/or the bottom side. An auxiliary shield that is electrically connected to the basic shield and is impervious to frequencies in the magnetic resonance range is disposed on the narrow sides.

The printed circuit board may be embodied as a rigid printed circuit board. Alternatively, the printed circuit board may be embodied as a flexible printed circuit board.

In one embodiment, the printed circuit board has only interconnect functionality and, if present, one or more local coils. For this reason, no electronic components other than matching resistors are connected at least to the conductor tracks that are connected to a contact of a further termination.

The basic shield may be embodied according to requirements. In one embodiment, the basic shield is implemented as a metal layer having a large surface area.

If the basic shield is embodied as a metal layer having a large surface area, the basic shield may have at least one cutout. The contacts of one of the terminations or of one of the further terminations may be disposed in a region of the cutout. Using this embodiment, a good shielding is achieved also in the region of the terminations and the further terminations.

The auxiliary shield may also be embodied according to requirements. For example, the auxiliary shield may be implemented analogously to the basic shield as a metal layer having a large surface area. Alternatively, the auxiliary shield may be embodied as a plurality of electrical plated-through holes extending from the top side to the bottom side and spaced apart from one another, viewed along the long lateral edges. Immediately adjacent plated-through holes may be spaced apart by a separation distance in the millimeter range, viewed along the long lateral edges.

At least one balun is mounted onto the basic shield and/or the auxiliary shield (e.g., at least in the operating state of the printed circuit board) for the purpose of suppressing standing waves. The balun may be mounted along with other components already during the manufacture of the printed circuit board. Alternatively, the balun may be mounted subsequently.

A local coil arrangement for magnetic resonance applications that has a printed circuit board according to the present embodiments is also provided. The local coil arrangement may be embodied, for example, as a spine coil.

DETAILED DESCRIPTION OF THE DRAWINGS

Figure 1:
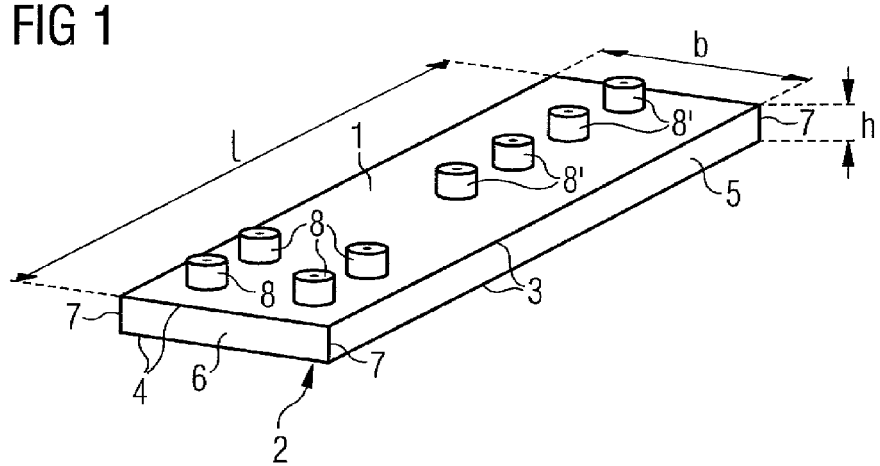
FIG. 1 shows a perspective view of one embodiment of a printed circuit board.
Figure 2:
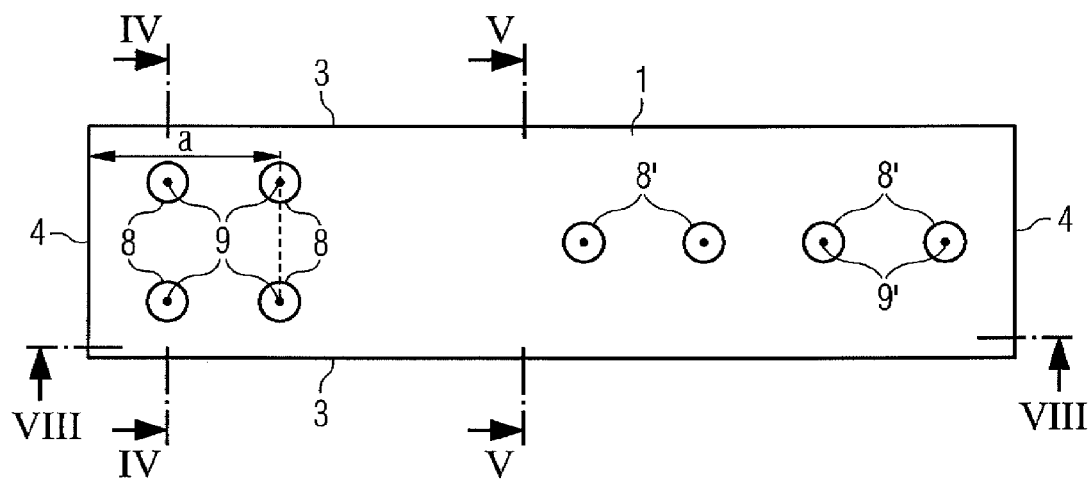
FIG. 2 shows a top view of one embodiment of the printed circuit board from FIG 1.
Figure 3:
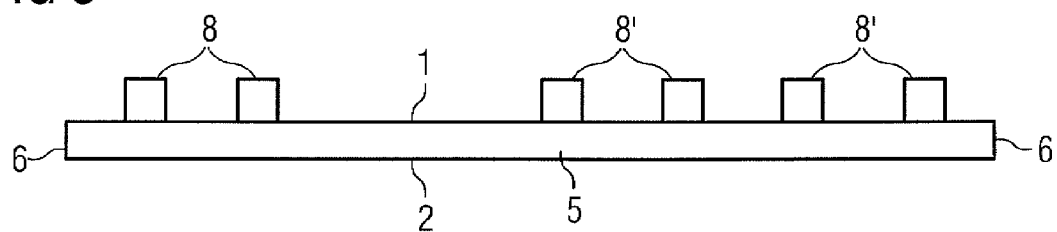
FIG. 3 shows a side view of one embodiment of the printed circuit board from FIG. 1.

According to FIGS. 1 to 3, a printed circuit board 1 is embodied as flat, with the result that the printed circuit board 1 has a top side 1 and a bottom side 2. Each of the top side 1 and the bottom side 2 is delimited by long lateral edges 3 and short lateral edges 4. Narrow sides 5 extend from the top side 1 to the bottom side 2 on the long lateral edges 3. End faces 6 extend from the top side 1 to the bottom side 2 on the short lateral edges 4. The narrow sides 5 and the end faces 6 adjoin one another at vertical edges 7.

The length l, the width b, and the height h of the printed circuit board 1 and the ratios between the length l, the width b, and the height h may be determined as necessary. In one embodiment, the length l is between 100 mm and 100 m (e.g., between 300 mm and 10 m). In one embodiment, the width b ranges from 1 mm to 100 mm (e.g., from 10 mm to 80 mm). In one embodiment, the height h ranges between 0.1 mm and 10 mm (e.g., between 0.3 mm and 3 mm). The ratio between length l and the width b may be greater than 3 (e.g., greater than 5). In one embodiment, the ratio between the width b and the height h is greater than 5 (e.g., greater than 10).

A plurality of terminations 8 for shielded cables is disposed on the top side 1 in proximity to one of the end faces 6. Four terminations 8 are shown in FIGS. 1 and 2. Alternatively, however, the number of terminations 8 may be greater or smaller. The phrase "in proximity" may be a distance separating the terminations 8 from the corresponding end face 6 that equals at a maximum 20% of the length l.

In one embodiment, the terminations 8 are configured as terminations for a coaxial cable. This embodiment is shown in FIGS. 1 and 2. In this embodiment, each termination 8 has one contact 9, and the number of terminations 8 is greater than one. Alternatively more than one contact 9 may be provided per termination 8. The number of terminations 8 may alternatively be equal to one or greater than one.

Figure 7:
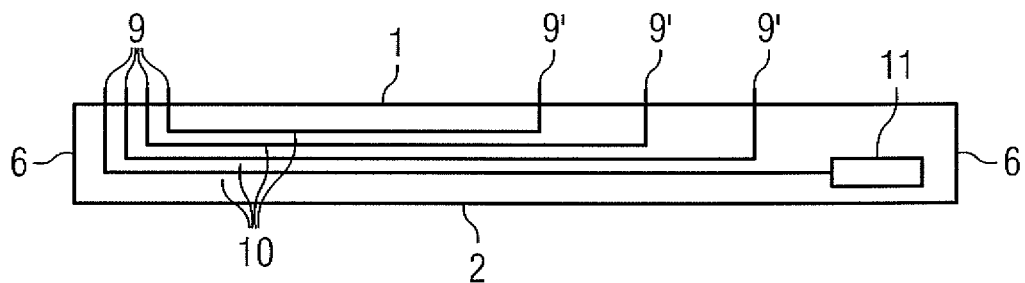

According to FIGS. 4 to 7, each contact 9 is connected to a respective conductor track 10. According to FIGS. 6 and 7, the conductor tracks 10 start from the respective contact 9 and extend in the direction of the other end face 6. The staggered representation of the contacts 9 in FIG. 7 is provided only for explanation. In practice, the contacts 9 may be disposed at the same height.

Each conductor track 10 serves for transmitting a signal from a local coil for magnetic resonance applications or for transmitting a signal to the local coil. The respective local coil may be disposed on the printed circuit board. The respective conductor track 10 is directly connected to the corresponding local coil (or to a corresponding preamplifier circuit). Alternatively, the local coil may be disposed outside of the printed circuit board. In this embodiment, the corresponding local coil is connected via a respective further shielded cable to a respective further termination 8', and the respective conductor track 10 connects the respective contact 9 of the respective termination 8 and the respective contact 9' of the respective further termination 8' to one another. The further termination 8' is alternatively disposed on the top side 1 (shown, normal case) or on the bottom side 2 (not shown, exception). If there is more than one further termination 8', at least one of the further terminations 8' may in each case be disposed both on the top side 1 and on the bottom side 2.

In one embodiment, only the terminations 8 and the further terminations 8' are disposed on the printed circuit board (e.g., no local coils are present). In this embodiment, all the further terminations 8' may be disposed in proximity to the other end face 6. The phrase "in proximity" may be a distance separating the further terminations 8' from the corresponding end face 6 that equals at a maximum 20% of the length l. However, at least one of the further terminations 8' may be disposed in proximity to the other end face 6. The other further terminations 8' may be disposed as necessary (e.g., the other further terminations 8' may alternatively be disposed in proximity to the other end face 6 or at any point between the two end faces 6). For example, at least one of the further terminations 8' may be disposed roughly in the center between the two end faces 6.

In one embodiment, at least one local coil 11 may be disposed on the printed circuit board 1. The local coil 11 may be disposed in proximity to the other end face 6 (e.g., definition of the term "proximity" same as previously). The further terminations 8', if present, may be further away from the other end face 6 than the local coil 11.

Figure 4:
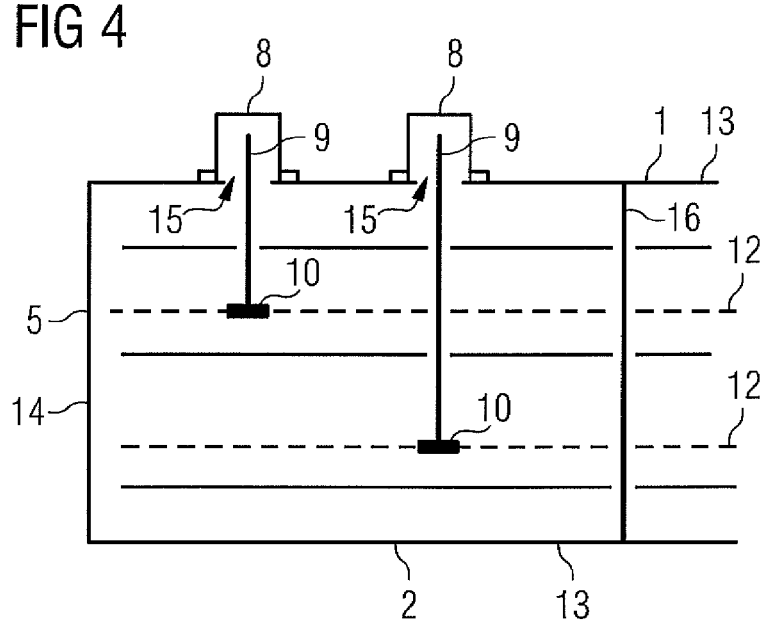
FIGS. 4 and 5 show cross-sectional views along lines IV-IV and V-V, respectively, of one embodiment of the printed circuit board from FIG. 2.
Figure 5:
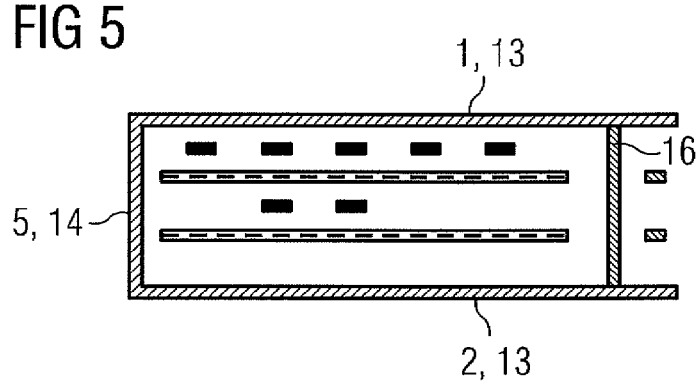
Figure 6:
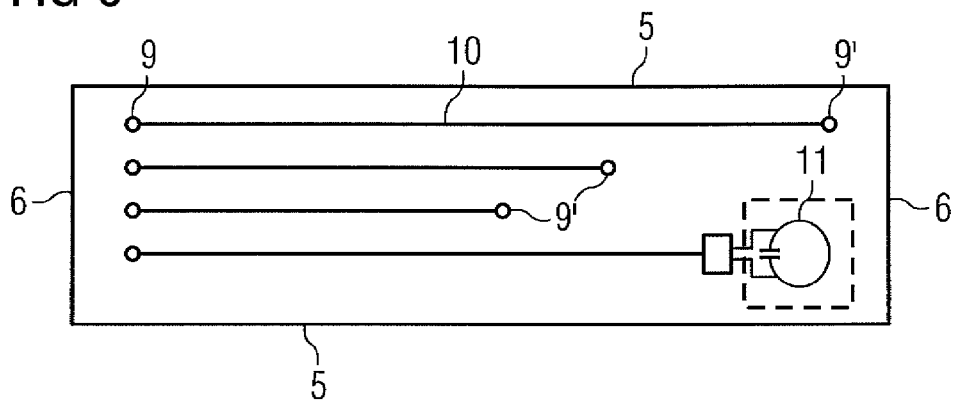
FIGS. 6 and 7 show the course of conductor tracks running in one embodiment of the printed circuit board from FIG. 1.

The conducting elements of the printed circuit board are shown in FIGS. 4 and 5. Insulating elements are not shown. According to FIGS. 4 and 5, the conductor tracks 10 run in at least one intermediate layer 12 of the printed circuit board 1. The intermediate layer is disposed between the top side 1 and the bottom side 2. Two intermediate layers 12 of this type are shown in FIGS. 4 and 5. In other embodiments, the number of intermediate layers 12 may be equal to one or greater than two.

Because the conductor tracks 10 run in the intermediate layers 12, a basic shield 13 that is impervious to frequencies in the magnetic resonance range (e.g., to frequencies up to $f=\gamma \cdot B$, where $\gamma$ is the gyromagnetic ratio of hydrogen and B is the strength of the basic magnetic field of the magnetic resonance system) may be disposed on the top side 1 and/or the bottom side 2. In different embodiments, the basic shield 13 may be disposed alternatively on the top side 1 or on the bottom side 2.

In one embodiment, the basic shield 13 is disposed both on the top side 1 and on the bottom side 2.

A shield 14 is also disposed on the narrow sides 5. The shield 14 is referred to hereinbelow as the auxiliary shield 14 in order to distinguish the shield 14 from the basic shield 13. The auxiliary shield 14 is connected to the basic shield 13 in an electrically conductive manner. Similarly to the basic shield 13, the auxiliary shield 14 is impervious to frequencies f in the magnetic resonance range.

The printed circuit board may be embodied as a rigid or flexible printed circuit board. In one embodiment, the printed circuit board is rigid if the height h is greater than 2 mm. The printed circuit board may be flexible if the height h is below 1 mm. Both embodiments may be possible in the range between 1 mm and 2 mm.

The conductor tracks 10 serve for transmitting signals from and to local coils. In one embodiment, no electronic components, with the exception of matching resistors, are connected at least to conductor tracks 10 that are connected to a contact 9' of a further termination 8'. In the case of the local coils 11, preamplifiers and drive electronics (e.g., detuning circuits) may be present.

The basic shield 13 may be configured according to requirements. For example, the basic shield 13 may include a narrow mesh (e.g., with a mesh width of 5 mm to 20 mm). In one embodiment, the basic shield 13 includes, according to the illustrations in FIGS. 4 and 5, a metal layer having a large surface area.

If the basic shield 13 is embodied as a metal layer having a large surface area, a passage for the contacts 9, 9' of the terminations 8 and further terminations 8' may be provided. This may be effected, for example, in that, as shown in the diagram in FIG. 4, the basic shield 13 has cutouts 15 at the corresponding points such that the contacts 9, 9' of the respective termination 8 and 8' are disposed in a region of the corresponding cutout 15. If the printed circuit board 1 has at least one local coil 11, the basic shield 13 may not be mounted in the region of the local coil 11. This is indicated by a dashed rectangle in FIG. 6.

Figure 8:
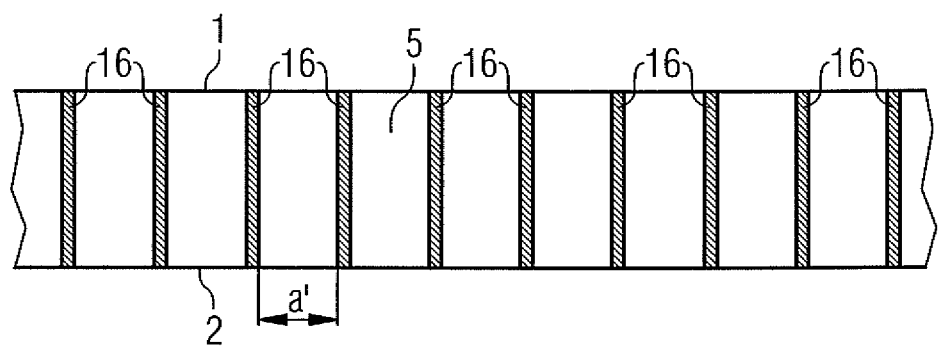
FIG. 8 shows a section along a line VIII-VIII through one embodiment of the printed circuit board from FIG. 2.

The auxiliary shield 14 may also be embodied according to requirements. For example, the auxiliary shield 14 may be embodied analogously to the basic shield 13 as a metal layer having a large surface area. An embodiment of this kind is shown on the left-hand side of FIGS. 4 and 5. In one embodiment, the auxiliary shield 14 is embodied according to the diagram shown on the right-hand side of FIGS. 4 and 5 as a number of electrical plated-through holes 16 (e.g., "vias" 16). The plated-through holes 16 extend from the top side 1 to the bottom side 2. The plated-through holes 16 are spaced at a distance from one another, viewed along the long lateral edges 5. According to FIG. 8, a distance a' separating immediately adjacent plated-through holes 16 from one another lies in the millimeter range, for example. The separation distance a' may range, for example, between 5 mm and 30 mm.

Owing to the presence of the basic shield 13 and the auxiliary shield 14, a disruptive interference effect of the radio-frequency magnetic field of the body coil on the signals transmitted over the conductor tracks 10 (and vice versa) is eliminated. Shield currents (e.g., standing waves) may nonetheless develop on the basic shield 13 and the auxiliary shield 14. According to FIG. 9, at least one balun 17 is mounted onto the basic shield 13 and/or the auxiliary shield 14 in order to suppress the formation of standing waves. The balun 17 may, for example, be soldered, screwed, and/or clamped onto the basic shield 13 and/or the auxiliary shield 14.

Figure 9:
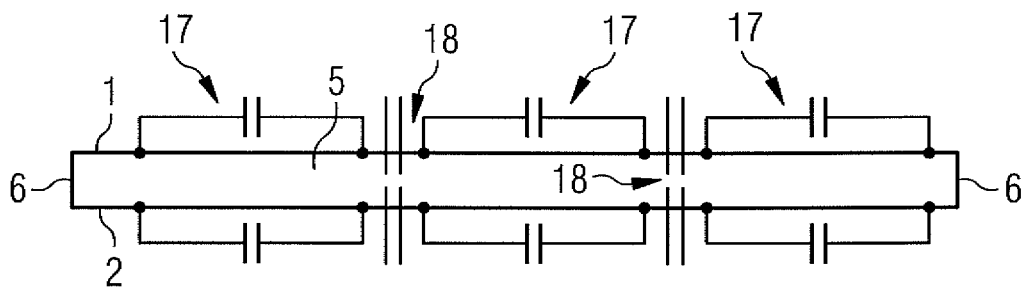
FIG. 9 shows a side view of one embodiment of the printed circuit board from FIG. 1.

If, as shown in FIG. 9, a plurality of baluns 17 are mounted onto the basic shield 13, a branch regions 18, in which at least one of the further terminations 8' is disposed, may be provided between the baluns 17 where appropriate.

The printed circuit board 1 according to one embodiment may be disposed, for example, in a local coil arrangement for magnetic resonance applications. An example of one embodiment of a local coil arrangement of the type is a spine coil.

The printed circuit board 1 according to the one embodiment has many advantages. The printed circuit board 1 allows a higher packing density than conventional shielded cables. This applies, for example, when the printed circuit board 1 is embodied as a multilayer printed circuit board. Also, the further terminations 8' may be disposed in a simple manner between the two end faces 6. Cable runs of different lengths may be achieved in a simple manner in the region enclosed by one and the same shield 13, 14. The fabrication of the printed circuit board 1 may also be automated, with the result that, for example, the branches (e.g., the further terminations 8' between the end faces 6) are no longer produced by hand. The printed circuit board 1 according to an embodiment may be manufactured economically and exhibits only small RF losses.

The above description serves solely to explain the present embodiments. The scope of protection of the present embodiments shall be determined using the attached claims.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A printed circuit board comprising:
    a top side;
    a bottom side;
    at least one intermediate layer disposed between the top side and the bottom side;
    a basic shield disposed on the top side, the bottom side, or the top side and the bottom side, the basic shield being impervious to frequencies in a magnetic resonance range;
    an auxiliary shield electrically connected to the basic shield and disposed on end faces that extend from the top side to the bottom side, the auxiliary shield being impervious to frequencies in the magnetic resonance range; and
    a first plurality of terminations configured for first shielded cables, the first plurality of terminations being disposed on the top side in proximity to one of the end faces;
    a second plurality of terminations configured for second shielded cables; and
    a plurality of conductor tracks that run the at least one intermediate layer, each conductor track being connected to a respective local coil configured for magnetic resonance applications and disposed on the printed circuit board or to a contact of a termination of the second plurality of terminations,
    wherein each termination of the first plurality of terminations has at least one contact connected to a respective conductor track of the plurality of conductor tracks, the respective conductor track extending from the at least one contact in the direction of the other of the end faces, and
    wherein the respective local coil, at least one termination of the second plurality of terminations, or the respective local coil and the at least one termination of the second plurality of terminations are disposed in proximity to the other of the end faces.

2. The printed circuit board as claimed in claim 1, wherein the printed circuit board is configured as a rigid or flexible printed circuit board.

3. The printed circuit board as claimed in claim 1, wherein no electronic components other than matching resistors are connected to conductor tracks of the plurality that are connected to contacts of the second plurality of terminations.

4. The printed circuit board as claimed in claim 1, wherein the basic shield comprises a metal layer having a surface area.

5. The printed circuit board as claimed in claim 4, wherein the basic shield comprises a cutout, and
wherein a contact of a termination of the first plurality of terminations is disposed in a region of the cutout.

6. The printed circuit board as claimed in claim 1, wherein the auxiliary shield comprises a metal layer having a surface area.

7. The printed circuit board as claimed in claim 1, wherein the auxiliary shield comprises a plurality of spaced apart electrical plated-through holes that extend from the top side to the bottom side.

8. The printed circuit board as claimed in claim 7, wherein immediately adjacent electrical plated-through holes of the plurality of electrical plated-through holes have a separation distance in a millimeter range.

9. The printed circuit board as claimed in claim 1, further comprising a balun mounted onto the basic shield or the auxiliary shield and configured to suppress standing waves.

10. The printed circuit board as claimed in claim 2, wherein no electronic components other than matching resistors are connected to conductor tracks of the plurality of conductor tracks that are connected to contacts of the second plurality of terminations.

11. The printed circuit board as claimed in claim 2, wherein the basic shield comprises a metal layer having a surface area.

12. The printed circuit board as claimed in claim 3, wherein the basic shield comprises a metal layer having a surface area.

13. The printed circuit board as claimed in claim 4, wherein the auxiliary shield comprises a metal layer having a surface area.

14. The printed circuit board as claimed in claim 5, wherein the auxiliary shield comprises a metal layer having a surface area.

15. The printed circuit board as claimed in claim 5, wherein the auxiliary shield comprises a plurality of spaced apart electrical plated-through holes that extend from the top side to the bottom side.

16. The printed circuit board as claimed in claim 6, wherein the auxiliary shield comprises a plurality of spaced apart electrical plated-through holes that extend from the top side to the bottom side.

17. The printed circuit board as claimed in claim 4, further comprising a balun is mounted onto the basic shield or the auxiliary shield and configured to suppress standing waves.

18. A local coil arrangement for magnetic resonance applications, the local coil arrangement comprising:
a printed circuit board comprising:
a top side;
a bottom side;
at least one intermediate layer disposed between the top side and the bottom side;
a basic shield disposed on the top side, the bottom side, or the top side and the bottom side, the basic shield being impervious to frequencies in a magnetic resonance range;

an auxiliary shield electrically connected to the basic shield and disposed on end faces that extend from the top side to the bottom side, the auxiliary shield being impervious to frequencies in the magnetic resonance range; and
a first plurality of terminations configured for first shielded cables, the first plurality of terminations being disposed on the top side in proximity to one of the end faces;
a second plurality of terminations configured for second shielded cables; and
a plurality of conductor tracks that run in the at least one intermediate layer, wherein a contact of each termination of the second plurality of terminations is connected to a respective conductor track of the plurality of conductor tracks; and
a local coil disposed on the printed circuit board, configured for magnetic resonance applications, and connected to a respective conductor track of the plurality of conductor tracks not connected to the contact of one of the second plurality of terminations;
wherein each termination of the first plurality of terminations has at least one contact connected to a respective conductor track of the plurality of conductor tracks, the respective conductor track extending from the at least one contact in the direction of the other of the end faces,
wherein the local coil, at least one termination of the second plurality of terminations, or the local coil and the at least one termination of the second plurality of terminations are disposed in proximity to the other of the end faces.

19. The local coil arrangement as claimed in claim 18, wherein the local coil is configured as a spine coil.

20. A multilayer printed circuit board comprising:
a top metal layer;
a bottom metal layer;
at least one intermediate layer disposed between the top metal layer and the bottom metal layer;
a shield electrically connected to the top metal layer and the bottom metal layer and disposed on end faces of the multilayer printed circuit board that extend from the top metal layer to the bottom metal layer, wherein the top metal layer, the bottom metal layer, and the shield are impervious to frequencies in a magnetic resonance range;
a first plurality of shielded cable terminations disposed on the top metal layer in proximity to one of the end faces;
a second plurality of shielded cable terminations disposed on the top metal layer or the bottom metal layer in proximity to the other one of the end faces; and
a plurality of conductor tracks that run in the at least one intermediate layer, each conductor track being connected to a contact of a respective termination of the first plurality of shielded cable terminations and to a contact of a respective termination of the second plurality of shielded cable terminations.

* * * * *